United States Patent [19]

Simpson et al.

[11] Patent Number: 4,794,370
[45] Date of Patent: Dec. 27, 1988

[54] PERISTALTIC ELECTROSTATIC BINARY DEVICE

[75] Inventors: George R. Simpson, Westport, Conn.; Herbert W. Sullivan, New York, N.Y.

[73] Assignee: Bos-Knox Ltd., Tulsa, Okla.

[21] Appl. No.: 854,821

[22] Filed: Apr. 23, 1986

Related U.S. Application Data

[63] Continuation-in-part of Ser. No. 642,752, Aug. 21, 1984, Ser. No. 642,997, Aug. 21, 1984, Ser. No. 642,996, Aug. 21, 1984, Ser. No. 683,619, Dec. 19, 1984, Ser. No. 819,917, Jan. 16, 1986, and Ser. No. 819,918, Jan. 16, 1986.

[51] Int. Cl.⁴ ............................................. H04Q 1/00
[52] U.S. Cl. ........................ 340/825.00; 340/825.81; 340/815.17; 340/815.27; 340/783; 350/269
[58] Field of Search ............... 340/763, 764, 783, 796, 340/815.27, 825.81, 815.17, 815.24, 825.88, 825, 360, 825.79; 350/266, 269, 270, 260; 40/491, 488, 579, 513

[56] References Cited

U.S. PATENT DOCUMENTS

| | | |
|---|---|---|
| 888,241 | 5/1908 | Kuhlmann . |
| 1,984,683 | 12/1934 | Jenkins . |
| 2,912,674 | 11/1959 | Aiken . |
| 2,952,835 | 9/1960 | Aiken . |
| 3,089,120 | 5/1963 | Aiken . |
| 3,304,549 | 2/1967 | Aiken . |
| 3,319,246 | 5/1967 | Aiken . |
| 3,373,422 | 3/1968 | Aiken . |
| 3,460,134 | 8/1969 | Aiken . |
| 3,553,364 | 1/1971 | Lee . |
| 3,600,798 | 8/1971 | Lee . |
| 3,648,281 | 3/1972 | Dahms et al. . |
| 3,877,791 | 4/1975 | Roach ............................ 350/360 |
| 3,897,997 | 8/1975 | Kalt . |
| 3,924,228 | 12/1975 | Goodrich . |
| 3,989,357 | 11/1976 | Kalt ............................... 350/269 |
| 4,013,345 | 3/1977 | Roach ............................ 350/360 |
| 4,062,009 | 12/1977 | Reverdy et al. . |
| 4,065,677 | 12/1977 | Micheron et al. . |
| 4,091,382 | 5/1978 | Anderson et al. . |
| 4,094,590 | 6/1978 | Kalt . |
| 4,105,294 | 8/1978 | Peck . |
| 4,113,360 | 9/1978 | Baur et al. ..................... 340/783 |
| 4,160,582 | 7/1979 | Yasuo . |
| 4,160,583 | 7/1979 | Ueda . |
| 4,163,162 | 7/1979 | Micheron . |
| 4,208,103 | 6/1980 | Kalt et al. ..................... 350/269 |
| 4,229,075 | 10/1980 | Ueda et al. . |
| 4,234,245 | 11/1980 | Toda et al. ................... 350/269 |
| 4,235,522 | 11/1980 | Simpson et al. .............. 350/360 |
| 4,248,501 | 2/1981 | Simpson ........................ 350/360 |
| 4,266,339 | 5/1981 | Kalt . |
| 4,336,536 | 6/1982 | Kalt et al. . |
| 4,383,255 | 5/1983 | Grandjean et al. . |
| 4,402,062 | 8/1983 | Batchelder .................... 340/783 |
| 4,418,346 | 11/1983 | Batchelder .................... 340/783 |
| 4,468,663 | 8/1984 | Kalt . |
| 4,488,784 | 12/1984 | Kalt et al. . |
| 4,531,121 | 7/1985 | Brown ............................ 340/764 |

FOREIGN PATENT DOCUMENTS

| | | |
|---|---|---|
| 2318474 | 2/1977 | France . |
| 2402220 | 3/1979 | France . |
| 2006944 | 5/1979 | United Kingdom . |

OTHER PUBLICATIONS

Petersen, K. E.-"Micromechanical Membrane Switches on Silicon" IBM J. Res. Develop., vol. 23, No. 4, (Jul. 1979) pp. 376-384.

(List continued on next page.)

Primary Examiner—John W. Caldwell, Sr.
Assistant Examiner—Edwin C. Holloway, III
Attorney, Agent, or Firm—Davis Hoxie Faithfull & Hapgood

[57] ABSTRACT

An array of binary elements suitable for alphanumeric or graphic displays are electrostatically actuated. The elements have a flexible member overlying a stator member. The flexible member has a bulge which is transferred along the element by sequential de-energization of a plurality of electrostatic electrode regions. Transfer of the bulge linearly shifts the flexible member with respect to the stator member to alter the state or to change appearance, light transmission, or electrical characteristics of the element.

16 Claims, 4 Drawing Sheets

OTHER PUBLICATIONS

Vuilleumier, R. et al.-"A Novel Electromechanical Microshutter Display" (9/27/83).

Langner, G. O.-"Light Gating Brightens CRT Image for Large Projection Displays", Electronics (Dec. 7, 1970) pp. 78-83.

Langner, G. O.-"CRT Display Target", IBM Technical Disclosure Bulletin, vol. 13 (Aug. 1970) pp. 60 & 61.

Aiken, W. R.-"An Electrostatic Sign-The Distec System" Soc. for Information Display (Jun. 1972) pp. 108, 109.

Bruneel et al., "Optical Display Device Using Bistable Electrets", Appl. Phys. Lett., vol. 30, No. 8 (15 Apr. 1977) pp. 382, 383.

Gallagher, R. T., "Microshutters Flip to Form Characters in Dot Matrix Display", Electronics (14 Jul. 1983) pp. 81, 82.

PERISTALTIC ELECTROSTATIC BINARY DEVICE

BACKGROUND OF THE INVENTION

This application is a continuation-in-part of our co-pending applications Ser. Nos. 642,752, 642,997, 642,996, filed Aug. 21, 1984, Ser. Nos. 683,619 filed Dec. 19, 1984, and Ser. Nos. 819,917 and 819,918 filed Jan. 16, 1986, the disclosures of which are hereby incorporated by reference.

This application is related to co-pending applications, Ser. No. 854,822 and Ser. No. 854,820, concurrently filed herewith and commonly assigned, the entire disclosures of which are also, incorporated by references.

This invention relates to electrostatically controllable electromechanical binary devices for use as an array in visual displays, switching matrices, memories, and the like.

The prior art contains various examples of electrostatic display elements. One type of device such as is shown in U.S. Pat. Nos. 1,984,683 and 3,553,364 includes light valves having flaps extending parallel with the approaching light, with each flap electrostatically divertable to an oblique angle across the light path for either a transmissive or reflective display. U.S. Pat. No. 3,897,997 discloses an electrode which is electrostatically wrapped about a curved fixed electrode to affect the light reflective character of the fixed electrode. Further prior art such as is described in ELECTRONICS, Dec. 7, 1970, pp. 78-83, and I.B.M. Technical Disclosure Bulletin, Vol. 13, No. 3, Aug. 1970, uses an electron gun to electrostatically charge selected portions of a deformable material and thereby alter its light transmissive or reflective properties.

Additional instruction in the area of electrostatically controlled elements useable for display purposes can be gained from the following U.S. Pat. Nos.: 4,336,536, Kalt et al.; 4,266,339, Kalt; 4,234,245, Toda et al.; 4,229,075, Ueda et al.; 4,208,103, Kalt et al.; 4,160,583, Ueda et al.; 4,160,582, Yasuo; 4,105,294, Peck; 4,094,590, Kalt; 4,065,677, Micheron et al.; 3,989,357, Kalt; 3,897,997, Kalt; and 888,241, Kuhlmann.

The present invention proceeds from material disclosed in Simpson U.S. Pat. No. 4,248,501, and Simpson et al. 4,235,522, the disclosure of which is incorporated herein by reference.

Of background interest are: W. R. Aiken: "An Electrostatic Sign—The Distec System", Society for Information Display, June 1972, pp. 108-9; J. L. Bruneel et al.: "Optical Display Device Using Bistable Elements", Applied Physics Letters, Vol. 30, no. 8, Apr. 15, 1977, pp. 382-3, an R. T. Gallagher: "Microshutters Flip to Form Characters in Dot-Matrix Display", Electronics, July 14, 1983, pp. 81-2.

Grandjean et al. 4,383,255 deals with the subject of the above Gallager Article. A plurality of shutters are ganged together to form a bar. A pattern of seven bars can display a numeral. Each bar requires an external lead. More on this subject can be found in "A Novel Electromechanical Micro-shutter Display" by R. Vuilleumier et al., a typescript not known to be a publication and showing a date "27.9.1983".

SUMMARY OF THE INVENTION

The present invention provides an electrostatically controllable electromechanical binary device for light reflective or light transmissive display arrays, switching matrices, memories, and the like. Each binary element in the array can be controlled individually by coordinate addressing. Coordinate addressing is employed to select a particular element for actuation. The location of an element in a two dimensional matrix can be its address in terms of the column and row at which the element is found. The columns and rows can be numerical values for variables such as x, y. According to the present invention, the address may comprise more than two dimensions or variables, for example W, X, Y, and Z. The invention will be described in the context of use as a visual display, including black and white and multi-color alpha-numeric and pictorial displays.

A display element (pixel) of this invention has a stator member including a plurality of stationary electrode regions and an electrostatically attractable, flexible member having a transverse bulge, buckle, hump, or undulation moveable back and forth across the stator member. In a eense, the flexible member resembles a carpet having a bulge which can be moved across the room by careful footwork.

The flexible member is electrostatically attractable by the electrode regions of the stator member. By arranging the electrode regions in a linear series, sequential energization of those regions will cause the bulge of the flexible member to progress linearly along the stator member in a peristaltic fashion. Reversing the energization sequence will drive the bulge in the reverse direction.

The flexible member is displaced linearly with respect to the stator a distance related to the size of the bulge in the direction of travel of the bulge. The linear displacement of the moveable member can alter visual or electrical characteristics, or can provide low force linear motion. The device is two-state or binary in character.

If the moveable flexible member of each display element is provided with an appropriate pattern of light and dark color filter, or opaque and translucent areas such as transverse bars, and it is viewed through a stationary mask having a corresponding appropriate pattern, the appearance of the element can be switched in color, or between light and dark by moving the bulge from one end of the flexible member to the other. The corresponding patterns of the mask and flexible member either will be in or out of registration. The display elements can control light transmission or light reflection or color qualities. Electrical characteristics can be switched or altered by registration and de-registration of circuit device components such as capacitor electrodes, inductance elements, magnetic circuit materials, and the like to affect circuit parameters.

DETAILED DESCRIPTION

Figure 1:
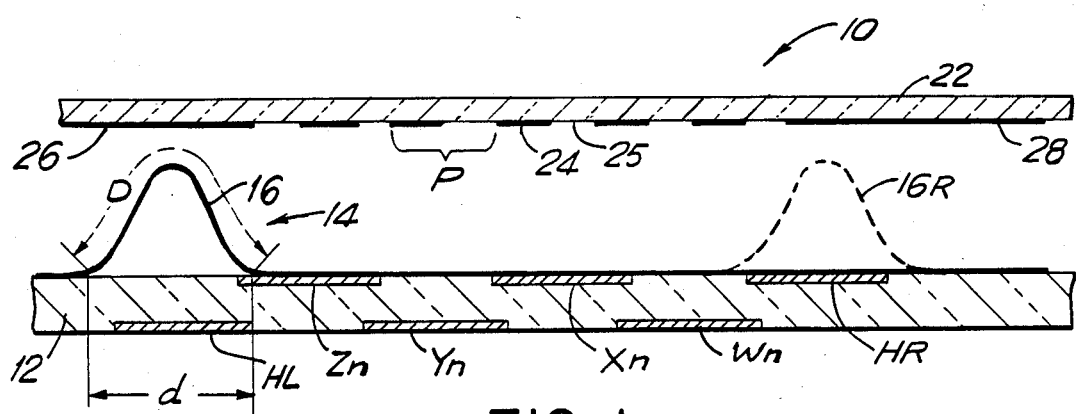
FIG. 1 is a sectional view of a display element in accord with the present invention.

FIG. 1 is a sectional view of a display element 10. The element of the illustrated example may be one of a lare field or array of display elements, each controllable between different visual states such as between a light and a dark state. Together the elements of the array can form the characters of an alphanumeric display or form an image for a graphic or video picture.

Figure 1A:
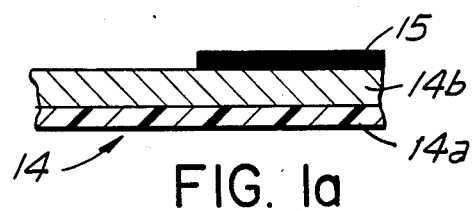
FIG. 1a is a cross-sectional view of the flexible member taken through Section 1a of FIG. 3.

A substrate 12 of glass or other suitable electrical insulator has formed thereon a plurality of electrode regions, in this example regions HL, Zn, Yn, Xn, Wn, and HR. Each electrode region is energized independently by suitable circuitry. A flexible member 14 is fixed at both ends to the substrate 12, but is free between the ends. Member 14 may be of metal foil or, as shown in FIG. 1a, a dielectric 14a such as polyethylene terephthalate (MYLAR) coated with a conductor 14b such as aluminum or indium tin-oxide. The flexible member 14 is longe than the distance between the fixed ends to cause a transverse bulge, buckle, hump, or undulation 16 to be formed. As illustrated, the thicknesses have been exaggerated for clarity.

A transparent cover 22 of glass or suitable plastic overlies the substrate 12 and flexible member 14 with enough clearance to accommodate the bulge 16. The cover 22 is shown in plan view in FIG. 2. The transparent cover is provided with a mask of an alternating pattern of opaque 24 and transparent 25 areas here shown as bars. Opaque areas 26 and 28 at either end conceal the bulge 16 when it is moved to either end of the display element 10.

Figure 3:
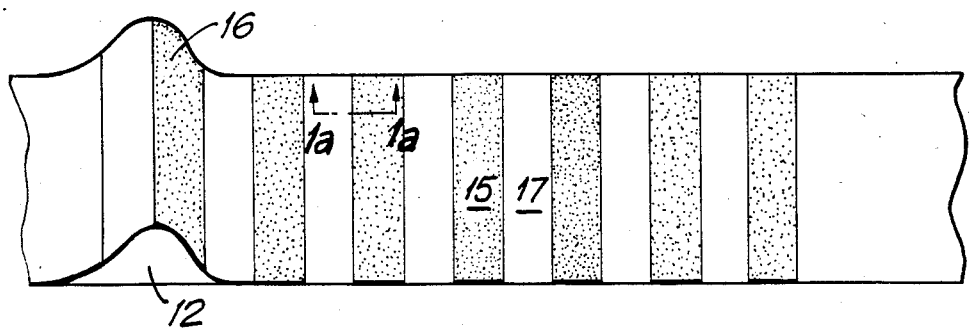
FIG. 3 is a plan view of the flexible member showing a corresponding pattern of light and dark bars.

FIG. 3 shows the moveable, flexible member 14 in place on substrate 12 with the transverse bulge 16 at the left end of the display element. The flexible member 14 is provided with a pattern of dark bars 15 and light bars 17 corresponding with the bar pattern of the mask on the cover 22 or substrate 12. When flexible member 14 is viewed through the mask pattern of the cover 22, either the dark bars 15 or the light bars 17 will be seen depending upon which of the two are in registration with the transparent areas 25 of the mask pattern of the cover 22. Alternatively, the mask pattern can be located on the stator substrate 12 with the flexible member 14 having translucent and opaque pattern areas 15, 17.

Progressing the bulge 16 of the flexible member 14 from the left end of the display element 10 to the right end will locate the bulge as shown in dotted outline at 16R in FIG. 1. Doing so has the effect of longitudinally or linearly shifting flexible member 14 to the right thereby altering which of the bars (dark 15 or light 17) of the flexible member are visible through the transparent bars 25 of the mask pattern of the cover 22. If the width of the bars is correctly chosen to correlate with the extent of longitudinal shifting of the flexible member 14, the appearance of the display element 10 will switch between light and dark when the bulge has been moved from one end to the ohher. The bar pattern on the flexible member can be alternating light and dark areas for a light reflective display. Alternatively, the bar patterns 24, 25 and 15, 17 can be alternating translucent and opaque or differently colored filter areas, or an alternating series of oriented polarizing filters which can be shifted into or out of phase, for a light transmissive display wherein a light source is located below a translucent substrate 22. In the latter form display element 10 constitutes a light shutter.

Figure 2:
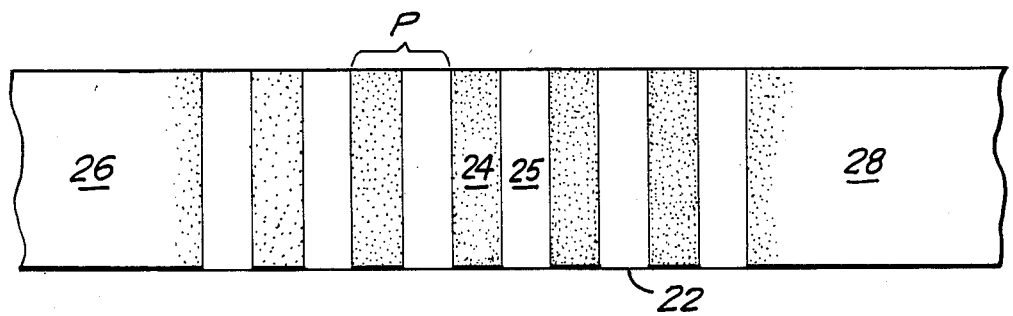
FIG. 2 is a plan view of the cover showing a barred mask pattern of opaque and transparent areas.

The bulge 16 is driven from one end to the other and retained latched at the chosen end by electrostatic force. Once driven from one end to the other, the bulge is hidden from sight by either of opaque areas 26 and 28 of the mask pattern of the cover 22. FIG. 1 shows the stator member 12 having a pattern of discrete electrode regions HL, Zn, Yn, Xn, Wn, and HL. The bulge 16 is illustrated in FIGS. 1-3 as being at the left end of the display element 10. To hold the bulge 16 latched at the left end, the electrode Zn adjacent the bulge remaining energized and the electrode HL directly under the bulge remains de-energized. To move the bulge to the right, the electrode Zn to the right of the bulge is de-energized and the electrode HL to the left of the bulge is energized. The bulge will halt over the deenergized electrode. To continue rightward movement the sequence of de-energizing the electrode to the right and energizing the electrode to the left continues. To propel the bulge to the left, the sequence is reversed.

The bulge 16 resides over a de-energized electrode region of the stator 12. By sequentially changing the location of the de-energized electrode region, the bulge is driven linearly along the stator in peristaltic fashion by the electrostatic attraction of the flexible member to the energized electrode region or regions behind the bulge. The electrode regions of the stator are separated electrically, but overlap slightly to assure that the beginning and ending margins of the bulge overlie electrode regions adjacent the de-energized region to permit the energized electrodes on either side of the bulge to attract the flexible member 14 at the margins of the bulge. Thus, the de-energized region below the bulge can attract the flexible member 14 when it is energized oo move the bulge toward the newly de-energized region in the direction of travel. Similarly, the electrode regions can be separated by gaps of chevron shape.

Referring again to FIG. 1, the bulge 16 occupies a dimension "d" along the stator 12, but because of its shape, is itself longer as is indicated by dimension "D". The linear shifting of the moveable member 14 occasioned by a traverse of the bulge from one end to the other is approximately equal to the difference between these distances or, $L=D-d$, where "L" is the linear extent of the shifting of the moveable member. The sum of the widths of one light and one dark region is the pitch "P" of the light and dark pattern areas 24, 25 and 15, 17 of the mask and moveable member is chosen to be equal to, or an odd fraction of, the linear movement L to assure complete registration and de-registration of the patterns as the moveable member is linearly reciprocated. $L=\frac{1}{2} NP$, where "N" is an odd integer.

Figure 7:
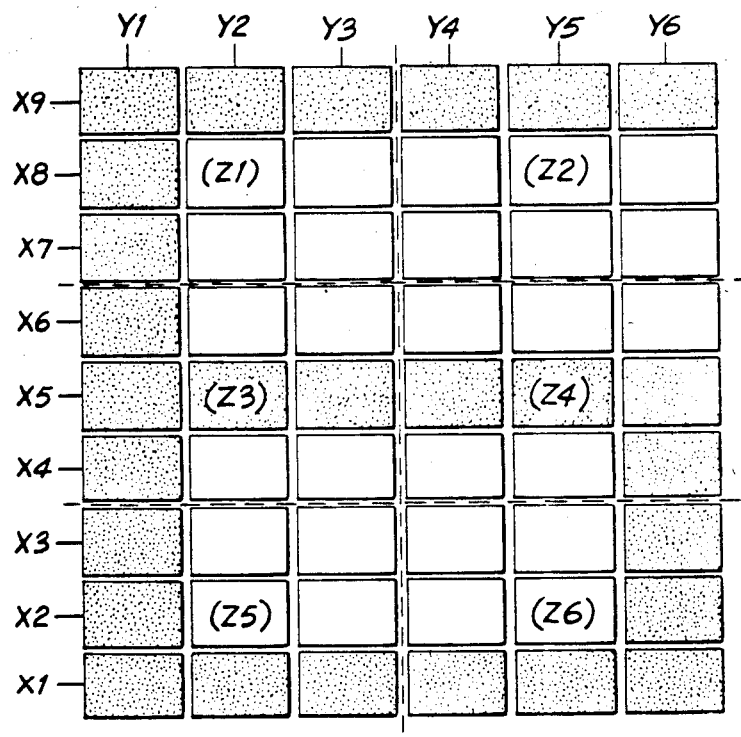
FIG. 7 is a schematic representation of an array of display elements according to the present invention.

FIG. 7 is a small six by nine element array of fifty four electrostatically actuated binary elements according to the present invention. Some of the elements are actuated to form a visual character, in this case the number "6" as indicated by the stippled areas. Actuation of the selected elements is achieved by providing a drive voltage to the X, Y, and Z electrode regions of the element at a particular address in the array. All X regions of each row are electrically connected together and to an X input lead (X1-X9) for that row. All Y regions in each column are connected together and to a Y input lead (Y1-Y6) for that column. All Z regions of each Z zone (Z1-Z6) are connected together and to an input lead for that zone. Thus, to form the left side of the character "6", the column input lead Y1, row input leads X1 through X9, and zone input leads Z1, Z3, and Z5 are energized sequentially. Similarly, to form the right side of the character, column input lead Y6, row input leads X1 through X5, and X9, and zone input leads Z2, Z4, and Z6 are energized sequentially.

EXAMPLE

Figure 4:
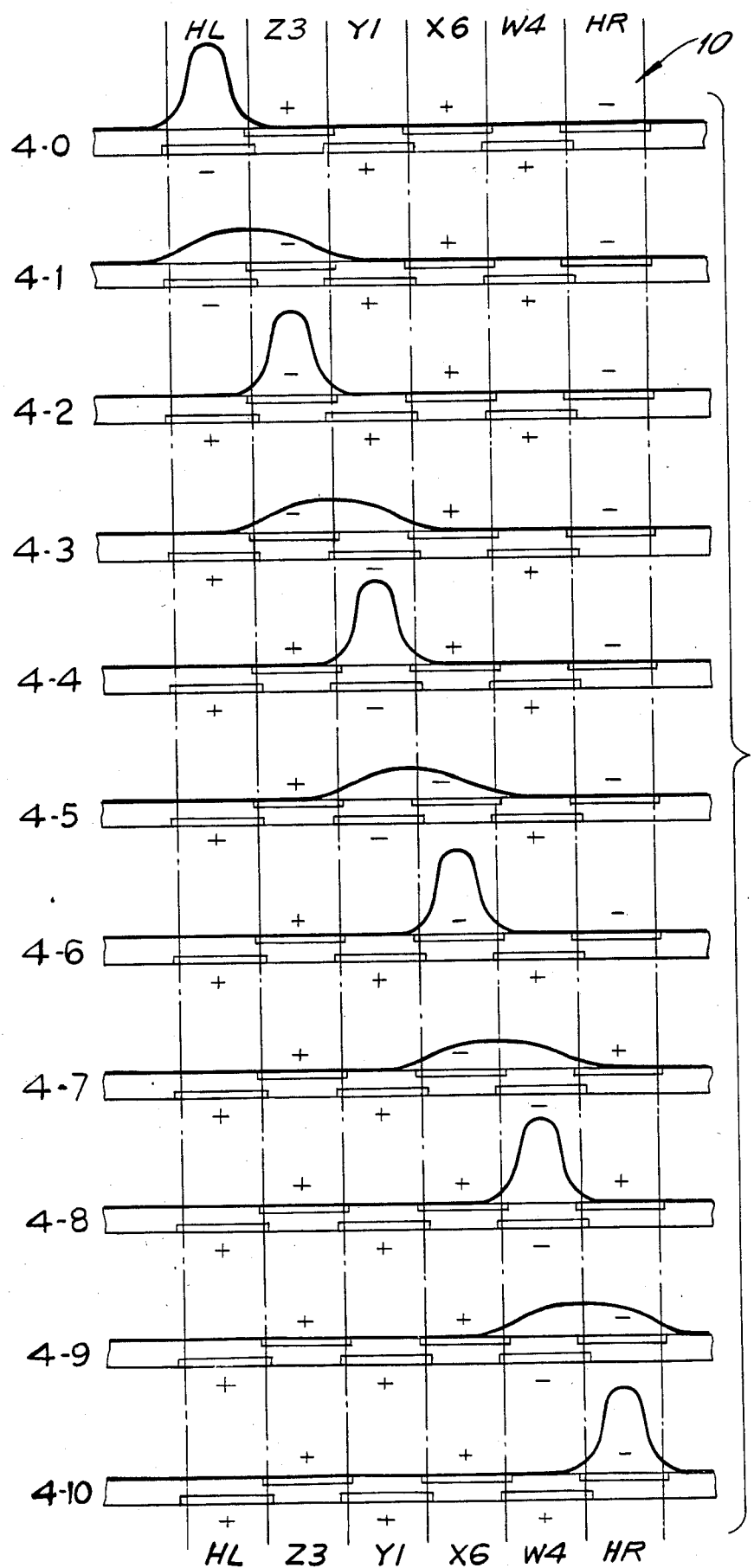
FIG. 4 is a series of cross-sectional views of one element showing how the bulge is traversed from left to right.

Table I and FIG. 4 illustrate the sequence to move the bulge from left to right for a particular device in an array of hundreds or thousands of such devices. Each element of the array has a discrete address having, in this example four address coordinates; Wn, Xn, Yn, and Zn, where "n" represents numerical address variable. The particular or target device, such as 10, chosen for this example has an address of Z3, Y1, X6, W4. Latching or holding electrodes HL and HR serve to hold the bulge 16 at either end of the device.

In this example both Table I and FIG. 4 employ a plus sign (+) to indicate an energized electrode and a minss sign (−) to indicate a deenergized electrode. FIGS. 4-1 through 4-10 correspond to steps 1 through 10 of Table I.

TABLE I

| STEP | HL | Z3 | Y1 | X6 | W4 | HR |
|------|----|----|----|----|----|----|
| 0 | − | + | + | + | + | − |
| 1 | − | − | + | + | + | − |
| 2 | + | − | + | + | + | − |
| 3 | + | − | − | + | + | − |
| 4 | + | + | − | + | + | − |
| 5 | + | + | − | − | + | − |
| 6 | + | + | + | − | + | − |
| 7 | + | + | + | − | − | + |
| 8 | + | + | + | + | − | + |
| 9 | + | + | + | + | − | − |
| 10 | + | + | + | + | + | − |
| 11 | + | + | − | − | + | − |
| 12 | + | + | − | + | + | − |
| 13 | + | − | − | + | + | − |
| 14 | + | − | + | + | + | − |
| 15 | − | − | + | + | + | − |
| 16 | − | + | + | + | + | − |

At step 0 (FIG. 4-0), the bulge 16 of the target device 10 is at the left overlying latching electrode HL which is de-energized. The other devices of the array may have bulges at either the left or at the right. The bulges overlie latching electrodes HL or HR which are de-energized. All address coordinate electrodes of the array are energized.

At step 1, the Z3 electrodes are de-energized. The bulge of the target device (and all other deiices having Z3 as an address coordinate) slacks to overlie both the HL and Z3 electrodes.

At step 2, the HL electrodes are energized driving the bulge(s) over the Z3 electrode(s).

At step 3, the Y1 electrode is de-energizing causing the target and the group of other devices having Z3 and Y1 as address coordinates to slack.

At step 4, Z3 is energized driving the bulge(s) over the Y1 electrode.

At step 5, X6 is de-energized.

At step 6, Y1 is energized driving over X6 the bulge the target and the small group having Z3, Y1, and X6 as address coordinates.

At step 7, W4 is de-energized and HR is energized.

At step 8, X6 is energized. Since only the target has all of the address coordinates including W4, only it moves over W4.

At step 9, HR is de-energized causing the target to slack.

At step 10, W4 is energized driving the target bulge to the final position over HR.

At this point in the sequence, the target is in its new position, but some other elements have been disturbed. Those sharing some of the address coordinates of the target are temporarily displaced. The following steps are housekeeping steps to return those displaced elements to the left.

At step 11, X6 and Y1 are de-energized.
At step 12, X6 is energized collecting bulges over Y1.
At step 13, Z3 is de-energized.
At step 14, Y1 is energized driving the bulges over Z3.
At step 15, HL is de-energized.
At step 16, Z3 is energized driving all nonselected bulges back to their starting position over HL.

It should be noted that energization or deenergization of an electrode region not proximate a bulge will have no effect. Thus, in step 3, deenergization of regions Y1 throughout the array affected only those elements having their bulges proximate regions Y1, to wit, those over Z3 which are proximate Y1. Those over Z3 which are proximate some other Y are unaffected. Similarly, de-energization of X6 in step 5 can affect only those elements which were affected by Z3 and Y1.

Had the assumption that the selected element initially was in a bulge-left state been wrong, no change in the selected element would have occurred for it still ends up in a bulge-right state.

Had the assumption been that the selected element was in the bulge-right state, the same steps would be followed, but the regions would have to be selected in reverse order, that is, in the order of W4, X6, Y1, Z3 to drive the selected element to the bulge-left state.

For clarity, the operation of the element has been described using numerous individual process steps, many of which could occur simultaneously.

Figure 5:
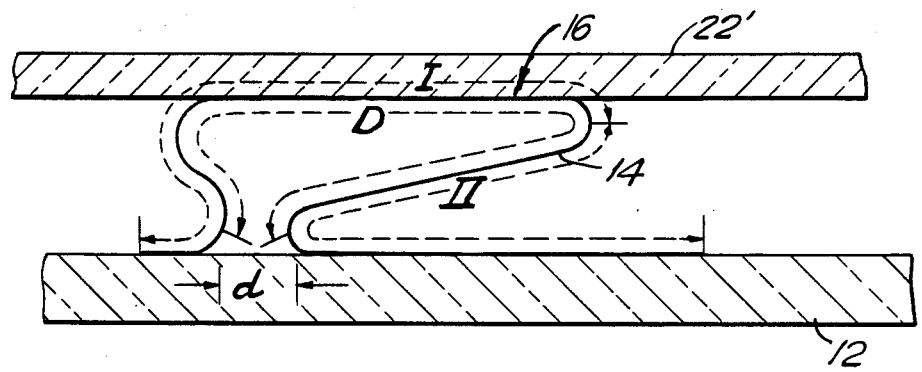
FIGS. 5 and 6 are schematic views of a variation of the flexible member shown in the two extremities of motion.
Figure 6:
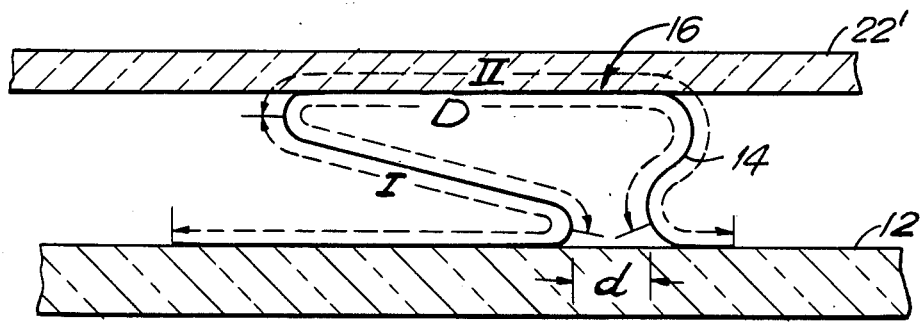

FIGS. 5 and 6 show a variation of the bulge 16 of FIG. 1. By making the length "D" of the flexible material 14 involved in forming the bulge 16 much greater than the distance along the stator "d", the linear extent of shifting, L=D−d is maximized. The bulge 16 is upwardly constrained by transparent cover 22' and assumes a shape of a loop or festoon or gather. By dividing the upper surface of the flexible material 14 into two or more different areas or colors, I and II, the appearance of the element will shift between color I and color II as the bulge is traversed from one end of the stator to the other. The details of stator 12 are not shown in FIGS. 7 and 8 as the stator 12 can be identical with that shown in FIG. 1. Furthermore, the loop can be used to store out of sight the undesired color while the desired color lies flat along the stator.

The invention has been illustrated and described with discrete electrode regions on the stator and a conductive coating on the flexible member. The configuration can be reversed with the discrete electrode regions on the flexible member and a conductive plane on the stator. A further configuration places the electrode regions on the cover to attract the bulge progressively forward and backward. In this configuration, the electrode regions can serve as the mask pattern. Still further, the flexible member can be a metal foil or have a conductive surface on the lower face if a dielectric material is positioned over the stator electrode regions. The stator need not be planar, but may be curved.

The elements can be manufactured by techniques such as phototeching or conductive ink printing. The size of individual elements is limited only by the limits of manufacturing technology.

The mass of the flexible member can be held to a minimum, and since only that small fraction of the flexible member which is the bulge is in motion, the force required to change the state of the element is extremely low. This allows operation of an array with electrical power requirements bordering on the trivial. Ambient light, for example, can be converted to provide operating power.

Because no mechanical restorative force is involved, the element is inherently stable, not only in each state, but also during actuation to change state. Thus, the elements are relatively insensitive to shock or vibration. A small residual charge of the dielectric 14a assures that a temporary loss of electrical power will not cause the elements to change state as is the case of elements which involve mechanical restorative force. The display or information is preserved until power is restored.

We claim:

1. An electrostatically attuated binary element comprising:
   a stator member having plural electrode regions arranged in a linear series, and
   a flexible member electrostatically attractable by the stator electrode regions,
   the flexible member overlying the stator member and having opposite ends fixed with respect to the stator member, the distance along the stator between the fixed ends being less than the length of the flexible member between the fixed ends to cause a bulge in the flexible member,
   the bulge being transferable along the element by sequential actuation of the electrode regions, effecting a linear displacement of the flexible member.

2. The element of claim 1 wherein the flexible member is patterned and a correlated stationary patterned mask is associated with the flexible member, whereby transfer of the bulge along the element alters the relation of the patterns and thereby the appearance state of the element.

3. The element of claim 2 wherein the mask pattern comprises alternating opaque and translucent areas and the pattern of the flexible member comprises alternating light and dark areas alternatively registerable with the translucent areas of the mask.

4. The element of claim 3 wherein the pattern areas of the mask and flexible member are in the form of bars transverse to the direction of transfer of the bulge.

5. The element of claim 3 wherein the mask pattern includes opaque regions at each end of the element to conceal the bulge of the flexible member.

6. The element of claims 2, 3, or 4 wherein the patterns of the mask and flexible member comprise registerable opaque and translucent areas to control the transmission of light.

7. An array of electrostatically actuated binary elements, each element of the array having a discrete address, each element comprising,
   a stator member having plural electrode regions arranged in a linear series, and
   a flexible member electrostatically attractable by the stator electrode regions,
   the flexible member overlying the stator member having opposite ends fixed with respect to the stator member, the distance along the stator member between the fixed ends being less than the length of the flexible member between the fixed ends to cause a bulge in the flexible member,
   the bulge being transferable along the stator by sequential actuation of the electrode regions to thereby change the state of the element, effecting a linear displacement of the flexible member,
   certain of the electrode regions being discrete address coordinate electrodes which when sequentially actauted cause only that element fully to change state.

8. The array of claim 7 wherein the flexible members are patterned and a correspondingly patterned mask is associated with each flexible member, whereby transfer of the bulge along the element alters the appearance state of the element.

9. The array of claim 8 wherein the mask patterns comprise alternating opaque and translucent areas and the patterns of the flexible members comprise alternating light and dark areas alternatively registerable with the translucent areas of the mask.

10. The array of claim 9 wherein the pattern areas or the masks and flexible members are in the form of bars transverse to the direction of transfer of the bulge.

11. The array of claim 9 wherein the mask patterns include opaque regions at each end of each element to conceal the bulge of the flexible members.

12. The array of claims 8, 9, or 10 wherein the patterns of the masks and flexible members comprise registerable opaque and translucent areas to control the transmission of light.

13. The device of claim 6 wherein the registerable opaque and translucent areas are light polarizing fitters registerable in or out of phase.

14. The device of any one of claims 1-5 or 7-11 wherein transfer of the bulge from one end of the element to the other effects a linear displacement of the flexible member.

15. A reciprocable electrostatically actuated binary device comprising: a stator member,
   a movable member linearly reciprocable by electrostatic force, and
   a plurality of electrode regions arranged in a linear series,
   the movable member always overlying the stator member,
   the electrode regions providing the electrostatic force for moving the linearly moveable member.

16. The electrostatic actuator of claim 15 wherein the electrode regions are on the stator member.

* * * * *